US009081927B2

(12) United States Patent
Coelho, Jr. et al.

(10) Patent No.: US 9,081,927 B2
(45) Date of Patent: Jul. 14, 2015

(54) MANIPULATION OF TRACES FOR DEBUGGING A CIRCUIT DESIGN

(71) Applicant: Jasper Design Automation, Inc., Mountain View, CA (US)

(72) Inventors: Claudionor José Nunes Coelho, Jr., Nova Lima / Minas Gerais (BR); Chien-Liang Lin, San Jose, CA (US); Chung-Wah Norris Ip, Cupertino, CA (US)

(73) Assignee: JASPER DESIGN AUTOMATION, INC., Mountain View, CA (US)

( * ) Notice: Subject to any disclaimer, the term of this patent is extended or adjusted under 35 U.S.C. 154(b) by 0 days.

(21) Appl. No.: 14/046,891

(22) Filed: Oct. 4, 2013

(65) Prior Publication Data

US 2015/0100932 A1 Apr. 9, 2015

(51) Int. Cl.
*G06F 17/50* (2006.01)

(52) U.S. Cl.
CPC ........ *G06F 17/5045* (2013.01); *G06F 17/5009* (2013.01)

(58) Field of Classification Search
CPC ................................. G06F 17/50; G06F 9/455
USPC .................................................. 716/111, 113
See application file for complete search history.

(56) References Cited

U.S. PATENT DOCUMENTS

| | | | |
|---|---|---|---|
| 5,247,468 | A | 9/1993 | Henrichs et al. |
| 5,748,124 | A | 5/1998 | Rosenthal et al. |
| 5,801,958 | A | 9/1998 | Dangelo et al. |
| 5,991,751 | A | 11/1999 | Rivette et al. |
| 5,999,726 | A | 12/1999 | Ho |
| 6,438,729 | B1 | 8/2002 | Ho |
| 6,496,972 | B1 | 12/2002 | Segal |
| 6,618,841 | B1 | 9/2003 | Huang |
| 6,633,878 | B1 | 10/2003 | Underwood |
| 6,694,501 | B2 | 2/2004 | Chang et al. |
| 6,714,902 | B1 | 3/2004 | Chao et al. |
| 6,721,929 | B2 | 4/2004 | Li et al. |
| 6,877,148 | B1 | 4/2005 | Hassibi et al. |
| 7,127,384 | B2 | 10/2006 | Zolotov et al. |
| 7,137,080 | B2 | 11/2006 | Acar et al. |

(Continued)

OTHER PUBLICATIONS

Non-Final Office Action dated Jul. 3, 2014 for U.S. Appl. No. 14/050,309.

(Continued)

*Primary Examiner* — Thuan Do
(74) *Attorney, Agent, or Firm* — Vista IP Law Group, LLP

(57) ABSTRACT

A viewer shows circuit design activities, displaying a signal, its corresponding trace, and the values of the trace over time. A global zoom-in, zoom-out, and zoom-fit are provided over the value display to adjust the time interval covered within the viewer. Non-linear manipulation of the traces within the viewer enables simultaneous zoomed in display of multiple time intervals, and zoomed out display of other time intervals. The non-linear manipulations may be performed within a same display region by designating zoom groups corresponding to the selection of a designated time period of activities of the circuit. Each zoom group may be scaled independently of other timer periods to zoom in or out of activities occurring within the designated time period. A list of behaviors may also be provided. Selection of a behavior generates a separate signal list for signals associated with the behavior and corresponding traces for enhanced debugging.

20 Claims, 7 Drawing Sheets

Generate Signal List Display and Trace Display
601

Receive Selection of Time Interval within Trace Display
603

Create Zoom Group
605

Adjust Scaling of Traces within Zoom Group Independently of Unselected Portions within Trace Display
607

(56) References Cited

U.S. PATENT DOCUMENTS 7,181,383 B1 2/2007 Mcgaughy et al.
7,195,594 B2 3/2007 Eigler et al.
7,243,322 B1 7/2007 Ly et al.
7,320,090 B2 1/2008 Coulter et al.
7,421,668 B1 9/2008 Ip et al.
7,493,240 B1 2/2009 Feng et al.
7,495,646 B2 * 2/2009 Kawabe et al. ................ 345/95
7,512,728 B2 3/2009 Tseng et al.
7,743,349 B2 6/2010 Gupta et al.
7,822,590 B2 10/2010 Kundert
7,827,017 B2 11/2010 Kundert
7,937,678 B2 5/2011 Lippmann et al.
7,962,886 B1 6/2011 Pandey et al.
8,020,124 B2 9/2011 Alexanian et al.
8,024,691 B2 9/2011 Zilic et al.
8,099,693 B2 1/2012 Pedenon et al.
8,136,068 B2 3/2012 Song et al.
8,161,425 B1 4/2012 Noice et al.
8,195,440 B2 6/2012 Feng et al.
8,201,137 B1 6/2012 Bhushan et al.
8,209,161 B2 6/2012 Zhu
8,224,636 B2 7/2012 Kundert
8,302,052 B2 10/2012 Lee et al.
8,418,094 B2 4/2013 Pedenon et al.
8,510,685 B1 8/2013 Rossman et al.
8,516,421 B1 8/2013 Ben-Tzur
8,627,249 B1 1/2014 Pandey et al.
8,671,373 B1 3/2014 Deaton
8,700,377 B2 4/2014 Bolcato et al.
8,738,348 B2 5/2014 Kundert
8,739,092 B1 5/2014 Ben-Tzur et al.
8,762,123 B2 6/2014 Kundert
8,775,149 B2 7/2014 Kundert
8,806,396 B2 8/2014 Liu et al.
2009/0018996 A1 1/2009 Hunt et al.
2009/0245353 A1 10/2009 Choi et al.
2011/0184714 A1 7/2011 Zhang et al.
2011/0307233 A1 12/2011 Tseng et al.
2012/0038648 A1 2/2012 Kundert

OTHER PUBLICATIONS

Notice of Allowance dated Oct. 23, 2014 for U.S. Appl. No. 14/050,309.

Virtuoso® Analog Design Environment User Guide, Product Version 5.1.41, Jul. 2007.

AvanWaves User Guide, Version 1997.2, May 1997.

Transaction-Based Verification: TestBuilder Reference Manual, Product Version 1.10, Jun. 2000.

Wang, Laung-Terng, Charles E. Stroud, and Nur A. Touba. System-on-chip test architectures: nanometer design for testability. Morgan Kaufmann, 2010.

U.S. Appl. No. 12/797,476, filed Jun. 9, 2010.

U.S. Appl. No. 14/044,681, filed Oct. 2, 2013.

U.S. Appl. No. 13/632,143, filed Sep. 30, 2012.

* cited by examiner

MANIPULATION OF TRACES FOR DEBUGGING A CIRCUIT DESIGN

BACKGROUND

This invention relates generally to analysis of circuit designs, and more particularly to manipulation of traces generated for a circuit design.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation, and formal verification.

During some of these verification techniques, a circuit design may be tested against a large set of properties to evaluate the operation of the circuit design. Properties are logical statements that describe some aspect of the circuit design. As the circuit design changes, the properties must be checked for consistency and re-written to comply with the design changes. Testing of the circuit design against a property may result in the generation of a number of traces that describe the activity or state of the circuit. For example, a trace may display a hi or low logical value of a clock, hex value of a register, indicate a change in value within a register, or other data about the circuit. These traces are often inspected in a viewer to verify and debug operation of the circuit.

Traditionally a viewer for debugging a circuit design consists of two columns, a first displaying a list of signals, and a second displaying the traces corresponding to the signals. Each signal is aligned with the associated trace in the same row, with vertical scrolls of the two columns being synchronized. The second column displaying the traces often has a zoom function, allowing the user to adjust the time scale on the horizontal axis amongst all the signals within the viewer.

Figure 1:
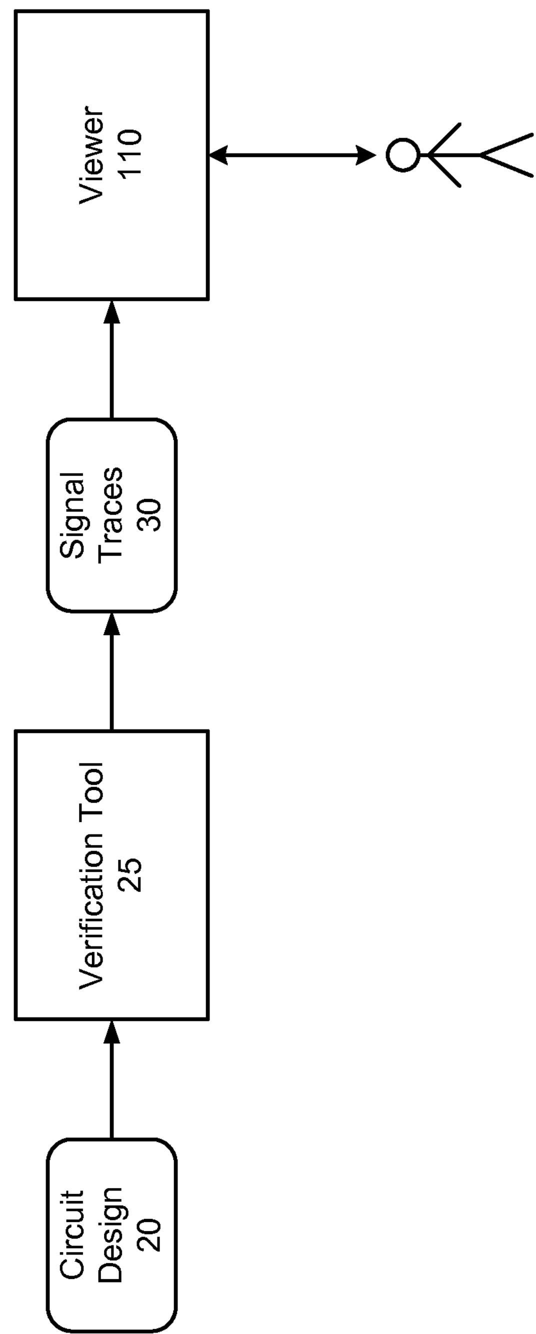
FIG. 1 is an example diagram of trace analysis in accordance with an embodiment of the invention.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

As circuit design complexity increases, it is harder and harder for the designers and verification engineers to analyze a typical trace within a viewer and comprehend the circuit design's activities over a long duration of time, usually across many clock cycles, and involving many signal traces. The description refers to signal traces received by the viewer for display. Each signal trace corresponds to a signal in a list of signals simulated during the testing of the circuit design and illustrates the value of the signal at a given time throughout the activities of the circuit design. A user may select from within the list of signals in the viewer to cause the viewer to display a trace corresponding to a given signal.

The viewer shows circuit design activities in display regions configured in a 2D array; a signal is matched to a corresponding trace showing values over time. A global zoom-in, zoom-out, and zoom-fit are provided over the value display to adjust the time interval (e.g., number of clock cycles) covered within the viewer. In order to look at the high-level activities across a long period of time, the viewer needs to zoom out from one or more traces, and yet, to debug the details of a trace within a specific time frame, the viewer needs to be zoomed in a lot. In a traditional viewer, these operations are incompatible, thus causing values of traces in another desirable time intervals to be outside of the displayable area of the viewer.

In an embodiment, non-linear manipulation of the traces within the viewer enables simultaneous zoomed in display of multiple time intervals of the trace, and zoomed out display of other time intervals. For example, various embodiments of the non-linear manipulation of a trace on the x-axis may be performed by creating one or more zoom groups having differing horizontal scaling factors along the time dimension within the viewer. A zoom group corresponds to the selection of a designated time period of activities of the circuit.

The scaling factor of a given zoom group may be maintained such that horizontal zooming within the viewer (e.g., along the entire timeline or within another zoom group) does not change the current scaling factor of the zoom group. Multiple zoom groups may be created and locked to a desired scaling factor. The viewer may maintain a single horizontal scroll showing the trace in a continuous display with varying degrees of scaling among the different zoom groups.

A zoom group may also be collapsed into an infinite zoom. In turn, the timeline may indicate the presence of a collapsed zoom group that may be expanded along the horizontal timeline. For example, the viewer may replace the portion of the trace corresponding to a collapsed time interval with a thick, selectable vertical bar, hiding the activities of the circuit design over the designated time period such that the viewer displays activities before the time interval and the activities after the time interval side-by-side. The vertical bar may be selected (e.g., clicked) to expand the zoom group to a different scaling factor, such as its scaling factor prior to being collapsed.

Additionally, one or more zoom groups may be anchored. An anchor group is broken out from the main viewing window to form an additional column of traces adjacent to the main viewing window, sharing the same signal list (i.e., the same traces are along the rows), and displaying the portion of the traces in the selected specified time interval. Horizontal zoom and horizontal scrolling within the anchor group may be performed independent to the main viewing window showing the full waveform.

In another embodiment, non-linear manipulation of the traces within the viewer may be performed along the y-axis. For example, the viewer may receive a selection of one or more signals for duplication within the viewer. The selected signals are duplicated in an additional viewing region, and may be stacked on top of the current trace and signal list. Zoom groups are maintained within the additional viewing region such that the horizontal scroll for duplicate traces within the viewer is synchronized with the traces in the original viewing region (and, in some embodiments, only one horizontal scroll bar is maintained for both sets of traces). Additionally, horizontal scroll between the signal listings may be synchronized in a similar fashion.

Additionally, the two viewing regions (old and new) stacked along the y-axis may have two independent vertical scroll (up/down), signal selection options (e.g., hide/show or expand/collapse a signal), etc.

Additionally, in some embodiments, the user may select from related signals, expressions, or properties for display in a duplicate viewing region. Unlike the above example where the user chooses which signals are displayed in the duplicate viewing region from the signal list, the viewer determines which signals to display in the duplicate viewing region based on the user's selection of an expression, property, or according to a grouping of related signals. For example, a property may have several associated signals of interest to the user when analyzing the activities of the circuit design based on the property. A list of these properties, groupings and/or expressions or "behaviors" may be provided to the user for selection and subsequent display.

The viewer determines the related signals based on the user's selection and automatically populates a newly added display region including the list of determined signals and their corresponding traces. For example, the newly added display region may include, for a signal, the signal itself (which may include expanded related signals); for an expression, the signal(s) referenced by the expression; and for a property, the signal(s) referred by the property's Boolean or temporal expression. Zoom groups may be maintained within the additional viewing region such that the horizontal scroll for duplicate traces within the viewer is synchronized with the traces in the original viewing region (and, in some embodiments, only one horizontal scroll bar is maintained for both sets of traces). Additionally, horizontal scroll between the signal listings may be synchronized in a similar fashion.

Additionally, the two viewing regions (old and new) stacked along the y-axis may have two independent vertical scroll (up/down), signal selection options (e.g., hide/show or expand/collapse a signal), etc.

The viewer may support multiple additional viewing regions. Thus, for example, the user may manually select signals to populate one region and navigate a list of behaviors to automatically populate another. Each region may include a filter option so that the signals whose names do not match the filter are temporary hidden from the display.

Trace Analysis

FIG. 1 illustrates an example diagram of trace analysis for a circuit design 20, according to an embodiment. Initially, a verification tool 25 receives a description of a circuit design 20. The description of the circuit design 20 describes the structural design and operation of a circuit. The description of the circuit design 20 may be embodied as register transfer level (RTL) source code encoded using a hardware description language (HDL) such as Verilog HDL or VHDL. In other embodiments, the description of the circuit design 20 may be embodied as a gate level netlist.

The verification tool 25 analyzes the description of the circuit design 20 and generates one or more signal traces 30 from the circuit design 20. The signal traces 30 specify values of registers and other elements in the circuit design 20 and thus describes the operation of the circuit design over a number of clock cycles.

In one embodiment, the verification tool 25 is a simulation tool that generates the signal traces 30 through simulation techniques. In another embodiment, the verification tool 25 is a formal verification tool that uses mathematical techniques to prove the correctness of properties specified for the circuit design 20. Tools that use formal methods to verify RTL source code and design properties are known as "model checkers." Formal verification tools are typically more exhaustive than simulation based testing and can exercise states of the circuit design that are missed by simulation.

Properties describe a behavioral relationship between signals of a circuit design. The properties may include assertions, where the assertion is satisfied if the property is true for all operating conditions of the circuit design 20. An example of an assertion is "if A is 1, B must be 1 in the next clock cycle." The properties may include covers, where the cover is satisfied if the property is true for some operating condition of the circuit design 20. An example of a cover is "if A is 1, B could be 1 in the next clock cycle," if it is observed that B sometimes but not always occurs after A. The properties may also include coverage holes, which are conditions that were never observed in the simulation data 25. An example of a coverage hole is "A and B were never asserted at the same time."

The viewer 110 may receive the one or more signal traces 30 that describe the activities of the circuit design throughout the testing. Each trace may specify the values of a register, a clock, or other monitored element within the circuit design 20 over time. The monitored elements within the circuit design may be referred to as signals, each having a corresponding trace 30 describing the operation of the element or one of its components over a number of clock cycles. The viewer 110 generates a display interface for viewing the signal traces 30 that is displayed to a user. The displayed traces may also be referred to as a waveform.

The viewer 110 may initially present two columns to the user. A signal list in a first column displays the signals currently selected for viewing by the user and may further provide the user with options to add, remove, or otherwise select signals for viewing. The names of the viewed signals (e.g., those chosen for the list) form the head of the rows along which their traces 30 are displayed.

A trace display in a second column displays the traces 30 showing the values of each signal at different times for the signals in the signal list. The scrolling up/down of the adjacent columns (e.g., in a row) is synchronized such that the name of a signal is always paired with its corresponding trace 30. The second column shows a continuous display of traces 30 with synchronized left/right scrolling, often with only the middle portion of the traces 30 during simulation shown to the user due to the sheer number of clock cycles and scaling factor within the viewer to discern the value of a signal represented by a trace 30.

The viewer 110 may further support split screen viewing of the signal traces with additional viewing regions that may form new columns or stack on top of viewing regions in existing columns to form rows. New columns may present themselves in the form of zoom groups. New rows may present themselves in the form of signal groups.

For example, in one embodiment, the viewer 110 may group received signals according to a variety of metrics. For example, signals related to a single component or related components of the circuit design 20 may be grouped. In the column showing the signal listing, the viewer 110 may collapse several signals under a single signal. For example, the viewer 110 may display a hex value stored in a register and collapse a collection of Boolean values generating the hex value. In another example, the viewer 110 may group the signals referenced by an expression or Boolean or temporal expression for a property. In turn, the viewer 110 may present the groupings of signals by their associated behavior to the user. For example, the viewer 110 may generate a third column listing the individual behaviors from which the user may select a behavior to view the associated group of signals in a new display region within the viewer 110.

Example display configurations of a display interface generated by the viewer 110 are presented below with reference to FIGS. 2-4 and embodiments of components of the viewer 110 are explained in more detail with reference to FIG. 5.

Example Viewer Displays

Figure 2:
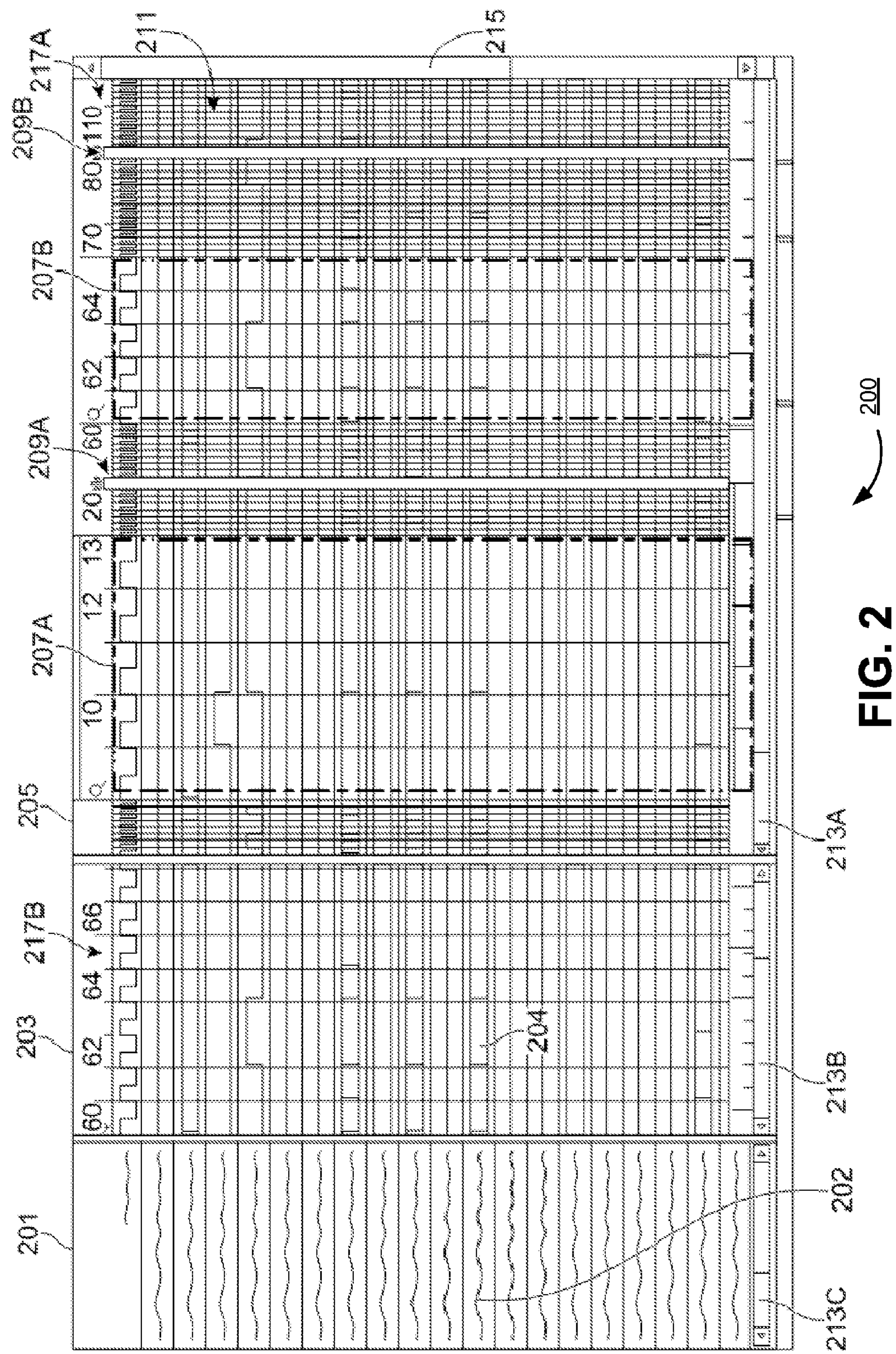
FIG. 2 is an example diagram of zoom groupings within a display interface generated by a viewer, in an embodiment of the invention.

FIG. 2 is an example diagram of zoom groupings within a display interface 200 generated by viewer 110, in an embodiment of the invention. As shown, the display interface 200 includes a signal listing display 201, a first trace display 203, and a second trace display 205. Each display corresponds to a column within the display interface 200. The signal listing display 201 shows the signals 202 for which corresponding traces 204 may be viewed in the trace display regions 203, 205. Vertical scroll 215 of the signals 202 and traces 204 may be synchronized such that the signal 202 is always matched with the corresponding trace 204 in a row. Horizontal scrolls 213A-C amongst the columns may be independent. A timeline 217A at the top of the interface 200 indicates the clock cycles for the portions of the traces shown in the interface 200.

FIG. 2 also illustrates a number of zoom groups (e.g., 207A, 207B, 209A, 209B) within the second trace display 205. Each zoom group may be created by selecting a time interval of the signal traces from the timeline (e.g., 217A), such as an interval of time between one clock cycle and another clock cycle. The zoom group 207B thus comprises the portions of traces within the selected time interval on the timeline 217A. Within the zoom group 207B, the horizontal scaling of the traces (and thus timeline 217A) may be adjusted independently of the portions of traces 211 within the trace display 205 outside of the zoom group 207B. Additionally, the scaling of zoom group 207B along the horizontal time dimension may be adjusted independently from that of other zoom groups (e.g., 207A). As shown, the scaling of zoom groups 207A and 207B is zoomed-in relative to the other portions of traces 211 within the trace display 205. However, the zoom groups 207A-B may be zoomed-out to show less detail than the other portions 211 of the traces.

A zoom group (e.g., 207B) may also be used to generate an additional trace display column. For example, trace display 203 is generated from zoom group 207B and anchored to form a new column. This results in a horizontal split screen view of the signal traces in which the horizontal scroll 213B of trace display 203 may be adjusted independently of the horizontal scroll 213A for trace display 205. Additionally, the scaling of traces within the trace display 203 may be adjusted independently of those in trace display 205. Another embodiment may not keep 207B in a trace display 205 as a zoom group after the trace display 203 has been created. As a zoom group incorporates only a subset 217B of the entire timeline 217A, the user may easily navigate only the subset 217B through the generation of the additional trace display 203.

In addition to zooming in/out to show more/less detail of traces within a zoom group, some zoom groups 209A, 209B representing uninteresting portions of the traces can be collapsed and thereby minimized from view in the interface trace display 205. Collapsed zoom groups 209A, 209B may be represented by thick, selectable bars within the trace display 205. In order to collapse a zoom group, the user first selects a time interval of the signal traces that should be included in the zoom group. In turn, the user may select an option to collapse the zoom group into a representation of a selectable bar. Should a user wish to view a collapsed portion of the traces (e.g., expand the zoom group 209B), the user may simply select (e.g., click or double click) the bar for a zoom group to re-display the portion of traces in the zoom group.

Figure 3:
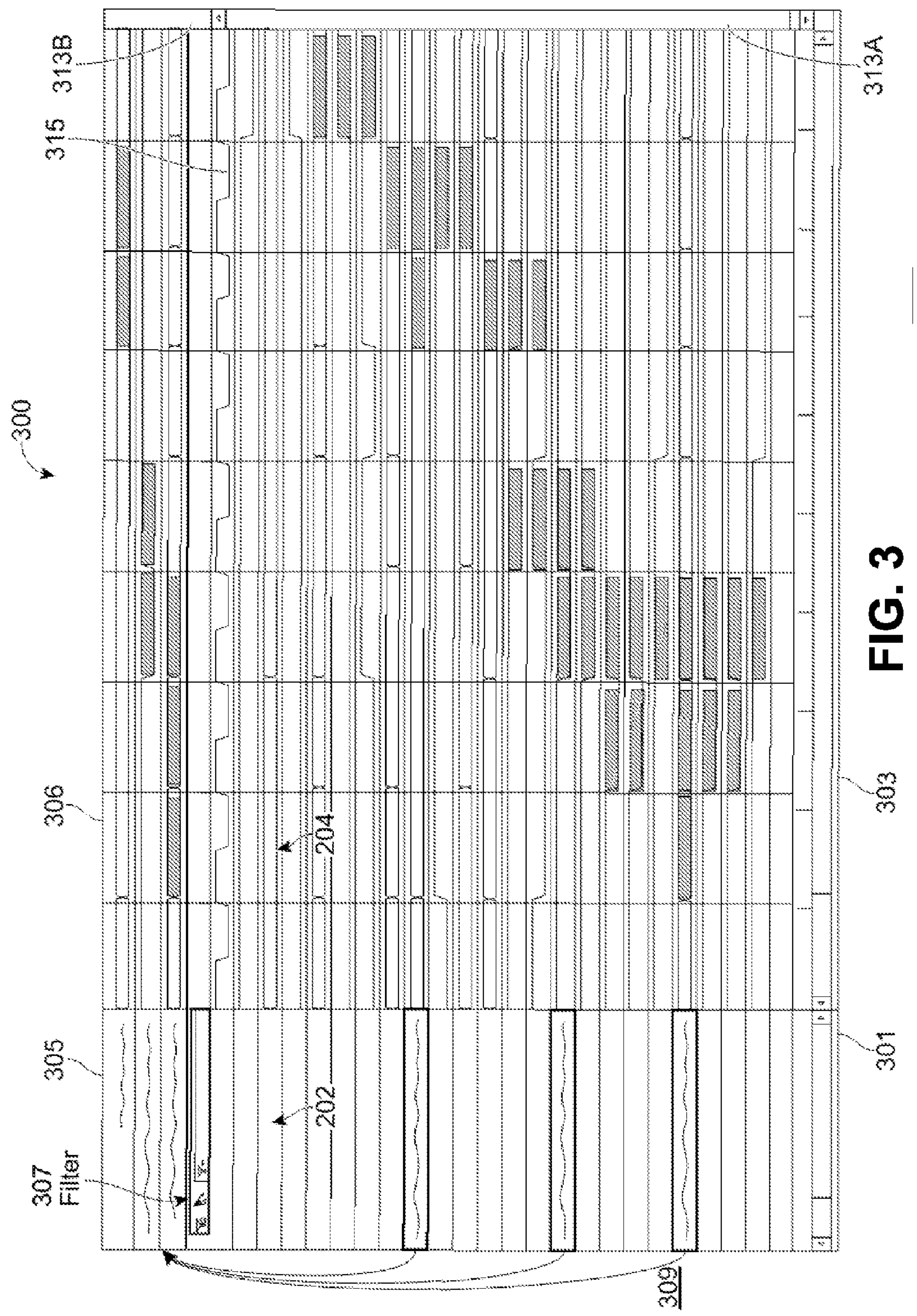
FIG. 3 is an example diagram of an additional display region within a display interface generated by a viewer, in an embodiment of the invention.

FIG. 3 is an example diagram of an additional display region within a display interface 300 generated by viewer 110, in an embodiment of the invention. As shown, the viewer 110 includes a first signal listing display 301, a first trace display 303, a second signal listing display 305, and a second trace display 306. The signal displays 301, 305 are stacked to form a column. Similarly, the trace displays 303, 306 are stacked such that traces in the trace display regions correspond to the signals in the signal display regions 301, 305. In other words, the display interface 300 represents a top/bottom split screen view of the signal traces.

Vertical scroll (e.g., 313A) of the signals 202 and traces 204 in a same row of display regions are synchronized such that a given signal is always matched with its corresponding trace. The vertical scrolls 313A, 313B for different rows of display regions may operate independently of each other and horizontal scrolls amongst different columns (e.g., columns 305/301 and 306/303) may also be independent. However, the horizontal scroll (not shown) for display regions (e.g., trace display regions 303, 306) in same column may be synchronized. Thus, within a column, the timeline 315 between the different trace displays 303, 306 is also synchronized.

As shown the first signal display 301 has available the entire (or larger) set of signals for display. The user may select 309 a subset of signals from within the first signal display 301 to generate the second signal display 306. In turn, the second trace display 306 is generated to display the traces corresponding to the selected 309 signals.

In some embodiments, a filter 307 is provided within a given signal listing display (e.g., 301) to enable the user to filter out unwanted signals and their traces from being displayed. The filter applies to the signal list in display 301, but may also be shown for signal list display 305.

Figure 4:
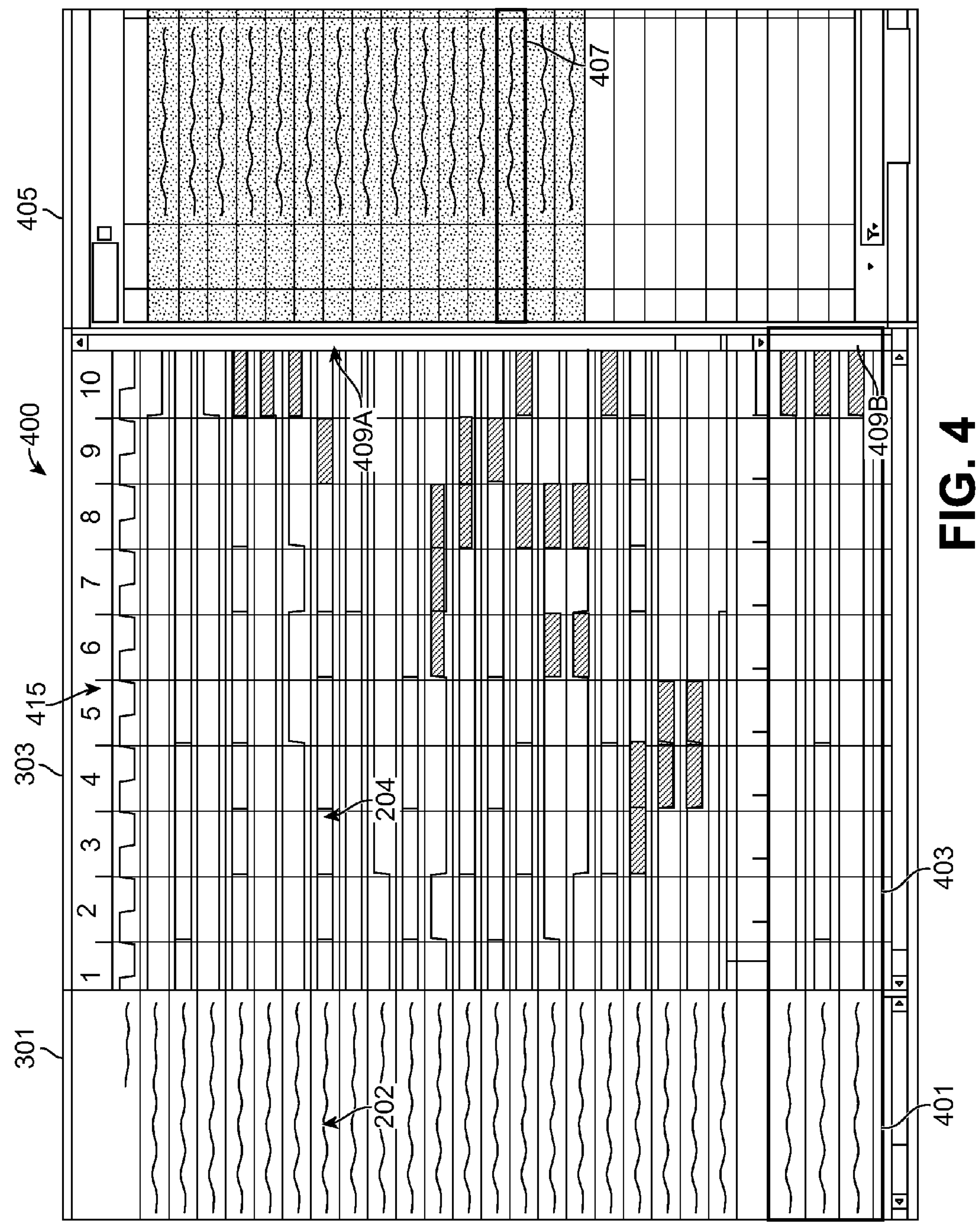
FIG. 4 is an example diagram of an additional display region corresponding to a signal grouping within a display interface of a viewer, in an embodiment of the invention.

FIG. 4 is an example diagram of an additional display region corresponding to a signal grouping within a display interface 400 generated by a viewer 110, in an embodiment of the invention. As shown, the display interface 400 includes a first signal listing display 301, a first trace display 303, a second signal listing display 401, a second trace display 403, and a behavior list display 405. The signal displays 301, 401 are stacked to form a column. Similarly, the trace displays 303, 403 are stacked such that traces in the trace display regions correspond to the signals in the signal display regions 301, 401.

Vertical scroll (e.g., 409A) of the signals 202 and traces 204 in a same row of display regions may be synchronized such that a given signal is always matched with its corresponding trace. The vertical scrolls 409A, 409B for different rows of display regions may operate independently of each other and horizontal scrolls (not shown) amongst different columns may also be independent. However, the horizontal scroll (not shown) for display regions (e.g., trace display regions 303, 403) in same column may be synchronized. Thus, within a column, the timeline 415 between the different trace displays 303, 403 is also synchronized.

As shown, there also exists a behavior listing display 405 showing a list of behaviors that have associated signals. The behaviors can be, for example, properties (e.g. assertions, covers) or expressions defined for the circuit design. Each behavior can be associated with one or more signals. For example, if the behavior is an expression, the signals can be the signals explicitly referred to by the expression. If the behavior is a property, the signals can be the signals from the property's Boolean or temporal expression. An example of a cover property, written in SVA format, is "A ##1 B", which refers to signals A and B, and describes a scenario in which signal A has value 1 at some clock cycle, while signal B has value 1 at the next clock cycle. An example of an expression, written in Verilog format, is "A && B", which refers to signals A and B, and describes the scenario in which signal A has value 1 and signal B has value 1 at the same clock cycle. Both expressions and properties may be used to describe "behaviors" of a circuit design.

Each of the behaviors can be displayed with a brief name describing the behavior and an indication of the type of the behavior (e.g., cover, assertion). The user may select 407 a behavior from within the behavior list display 405 to cause the generation of a second signal listing display 401 containing only the signals associated with the selected 407 behavior. In turn, a corresponding second trace display 403 is generated to display the traces in association with the signals for the selected 407 behavior. In the illustrated example, the selected 407 behavior has three associated signals that would be of interest to the user when analyzing the circuit behavior.

As the user moves the focus of the display 405 from the originally selected 407 behavior to another behavior within the signal grouping display 405, the second signal listing display 401 and trace display 403 are updated automatically to replace the signals and traces from the previous selection and to display only the signals and traces corresponding to the new selection.

Viewer Components

Figure 5:
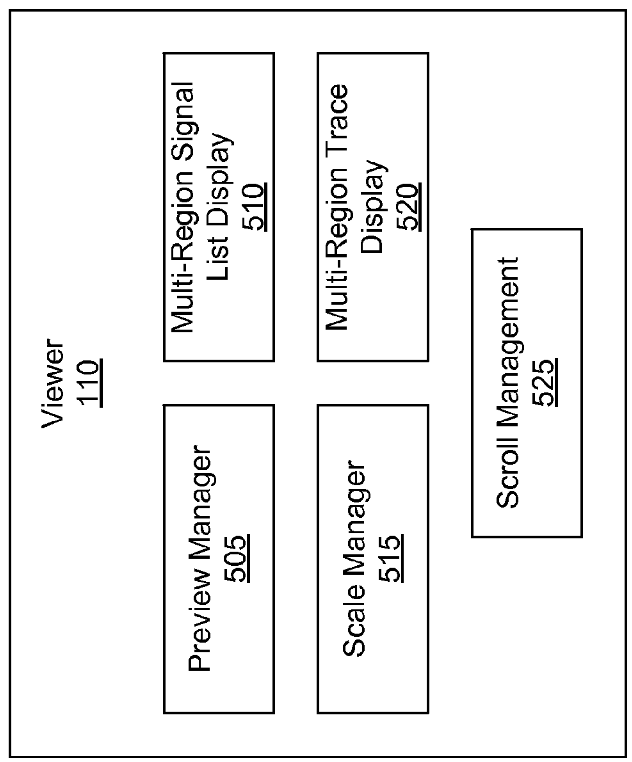
FIG. 5 is an example diagram of a viewer for managing nonlinear manipulation of traces, in accordance with an embodiment of the invention.

FIG. 5 illustrates an embodiment of a viewer 110 for managing nonlinear manipulation of traces, in accordance with an embodiment of the invention. As shown, the viewer 110 may include a number of modules including a preview manager 504, multi-region signal list display 510, scale manager 515, multi-region trace display 520, and scroll management 525. In one embodiment, the viewer 110 is a standalone program operating on a computer system. In other embodiments, the viewer 110 may be incorporated as an executable module within a larger software suite.

The multi-region signal list display module 510 or "signal display module" generates lists of signals for display in within multiple signal display regions. The signal display module 510 generates a core signal display region which provides the user with access to the various signals received at the viewer 110. Additional signal display regions may be specified manually by the user or determined by the viewer 110. The multiple signal display regions may be stacked in a column and optionally have a synchronized horizontal scroll (e.g., as shown in FIGS. 3 and 4). By stacking the signal display regions, the traces corresponding to each signal visible within the signal display regions may be shown in an adjacent column. The vertical scroll for each signal display region may be independent.

Within the core signal display region, the user may select one or more signals which may be duplicated for display in a first additional signal display region. Alternatively, the user may select from behaviors having associated groupings of signals (e.g., by expression or property) determined by the viewer 110. In turn, the signal display module 510 generates a second additional signal display region comprising the signals associated with the selected expression or property.

Upon selection of another property or expression, the signal display module 510 updates the signal listing the in the additional signal display regions to include those associated with the newly selected expression or property. The signals associated with the prior selected property or expression may be removed from the additional signal display region. Depending on the embodiment, the signal display module 510 may enable the user to specify any number of additional signal display regions.

The multi-region trace display module 520 or "trace display module" generates a trace display region corresponding to each signal display region. In instances where the signal display module 510 has generated multiple signal display regions, the trace display module 520 generates a number of addition trace display regions that may be stacked in a column and have a synchronized horizontal scroll (e.g., as shown in FIGS. 3 and 4) and timeline. By stacking the trace display regions, the traces corresponding to each signal visible within the corresponding signal display regions may be shown in the column. Each trace display region's vertical scroll is synchronized with that of its corresponding signal display region.

In some embodiments, a time interval of trace display regions may be selected (e.g., through the formation of a zoom group) to form an additional column. Each additional column may contain a same number of trace display regions as the original column and each trace display region therein may have a synchronized vertical scroll with the same corresponding trace display in the original column. An additional column, however, may only include portions of a trace for a specific time interval as selected within the original column by the user. Further, the additional column may include a horizontal scroll independent from any other columns.

The scale manager module 515 manages the zoom scaling of traces within the trace displays generated by the trace display module 520. Each column of trace displays may have independent levels of overall zoom. Zooming in within a trace display causes the horizontal timeline for the column to expand and show fewer clock cycles for traces within the trace display. Thus, the scale manager module 515 may receive commands from the user to zoom in within the trace display to scale traces horizontally and show greater detail within the displayed section.

Oppositely, zooming out within a trace display causes the horizontal timeline for the column to shrink and show more clock cycles for traces within the trace display. Thus, the scale manager module 515 may receive commands from the user to zoom out within the trace display to scale traces horizontally and show less detail within the displayed section. The user may independently manipulate other columns in a similar fashion.

The scale manager module 515 may further enable the user to select a time interval in the horizontal timeline/a number of clock cycles to create a zoom group. The zoom group may either be configured within the column itself or utilized to generate a new column of trace display(s). In the case of generating a new column of trace displays, the scale manager module 515 maintains a synchronized horizontal scroll independent of the original column and a horizontal timeline only spanning the selected time interval for the new column. Thus, only a portion of each trace (based on the selected time interval) from the original trace displays may be available for display within the trace displays in the new column. In turn, the scale manager module 515 may receive instructions from the user to scale the new column independently from the original column.

In the case of generating a zoom group within a column of trace displays, the scale manager module 515 maintains one horizontal scroll for the column while providing the user with options for modifying the scaling of the horizontal timeline spanning only the selected time interval in the column. Thus, the scaling of only a portion of each trace (based on the selected time interval) may be modified within the column utilizing the zoom group. The scale manager module 515 maintains the desired level of scaling within the zoom group independent of the scaling within the trace display region and any other number of zoom groups within the same column.

The scale manager module 515 may also receive an instruction from the user to collapse a zoom group within a column of trace displays. The scale manager module 515 collapses the selected zoom group into an infinite zoom out and indicates the presence of the collapsed zoom group in the interface. For example, the scale manager module 515 may replace the zoom group with with a thick, selectable vertical bar, hiding the signals over the designated time interval of the zoom group. In turn, the scale manager module 515 may receive a subsequent selection (e.g., click) on the bar representing the zoom group to expand the zoom group to its scaling factor prior to being collapsed.

The scroll management module 525 synchronizes the horizontal and/or vertical scrolls amongst the different display regions for traces and signal lists. For example, the scroll management module 525 synchronizes horizontal scrolling of display regions within a same column. Accordingly, the traces within a column have matching timelines. Additionally, the scroll management module 525 synchronizes vertical scrolling between the signal list displays and the corresponding trace displays (e.g., across a row). Accordingly, when a signal is displayed in the signal list display, the trace corresponding to the signal is displayed along the same horizontal (row) across the trace display regions—although different portions of the trace may be displayed in different columns.

The preview manager module 505 generates a behavior listing that groups signals relevant to a particular behavior. The behavior listing may correspond to a particular component having a number of associated signals such as a register, or alternatively, a property or expression having a number of associated signals. The preview manager module 505 displays the behavior listing to the user for selection. In response to a selection of a behavior, the preview manager module 505 instructs the signal list display module 510 and trace display module 520 to create a new signal list display region and a new trace display region within each column. In turn, the signals associated with the behavior are displayed in the new signal list display region and the corresponding traces are also displayed in the new trace display regions. In some embodiments, when the user makes a further selection within the list of behaviors, the preview manage module 505 replaces the signal listing within the previously created signal list display region. In turn, the traces corresponding to the signals in the newly selected behavior are used to populate the trace display regions.

Example Operations of Viewer

Figure 6:
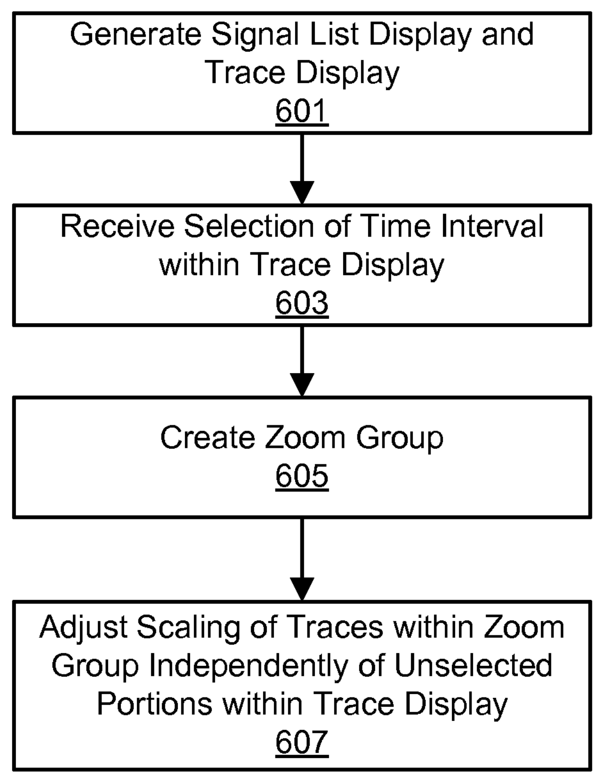
FIG. 6 is a flow chart of an operation of a viewer managing nonlinear manipulation of traces, in accordance with an embodiment of the invention.

FIG. 6 is a flow chart of an operation of a viewer 110 managing nonlinear manipulation of traces, in accordance with an embodiment of the invention. The viewer 110 receives a signal list and signal traces 30 from the verification tool 25.

In turn, the viewer 110 generates 601 a signal list display region and an adjacent trace display region. The signal list display region displays the signals and the trace display region displays the trace corresponding to each signal. The list of signals extends vertically and each trace extends horizontally along a timeline of circuit activity.

The viewer 110 receives 603 a selection of a time interval within the trace display. The selected time interval marks the start and end points for a zoom group spanning corresponding portions of the traces within the trace display region. The viewer 110 creates 605 the zoom group and adjusts 607 a scaling factor of the traces within the zoom group along the timeline independently of unselected portions within the trace display that are outside of the zoom group.

Figure 7:
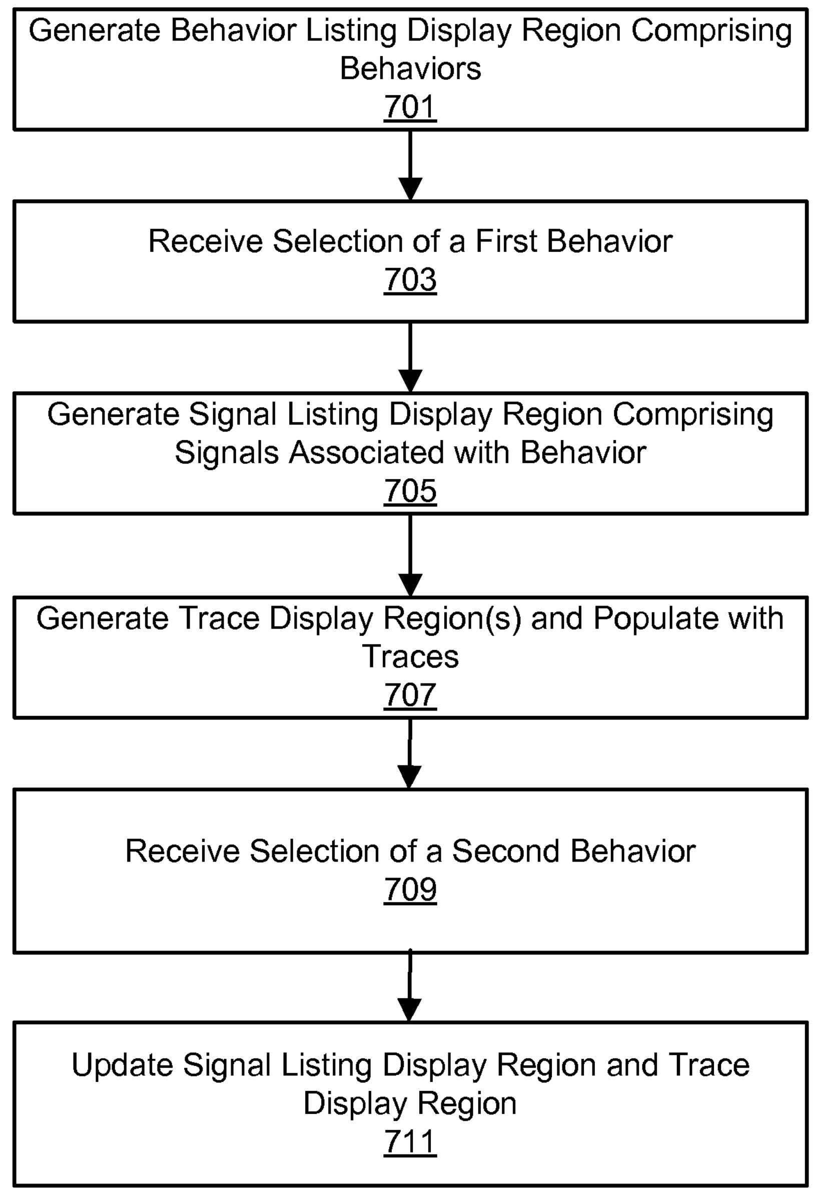
FIG. 7 is a flow chart of an operation of a viewer managing the display of behaviors and traces, in accordance with an embodiment of the invention.

FIG. 7 is a flow chart of an operation of a viewer 110 managing the display of behaviors and traces, in accordance with an embodiment of the invention. The viewer 110 first receives a behaviors defined for the circuit design and signal traces 30. The viewer 110 then generates 701 a behavior listing display region that includes a list of the behaviors.

The viewer 110 receives 703 a selection of a first behavior having an associated group of signals and generates 705 a signal list display region listing the signals in the group associated with the first behavior. A trace display region is generated 707 and populated with a group of the traces corresponding to the signals in the signal list display and associated with the selected behavior. The behavior listing display region, signal list display region, and trace display region may be part of the same interface and displayed concurrently as shown in FIG. 4.

The viewer 110 may subsequently receive a selection 709 of a second behavior having an associated group of signals. In response to the selection, the viewer 110 updates 711 the signal listing display region and the trace display region. The viewer 110 performs the updating by replacing the listing of the signals in the signal display region with those associated with the second behavior and repopulates the trace display region with those traces that correspond to the updated listing of signals.

Additional Considerations

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a non transitory computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A non-transitory computer-readable storage medium comprising computer program code for circuit design analysis, the computer program code comprising code for:
- receiving signal traces for verification of a circuit design;
- generating a signal list display region and a trace display region, the trace display region including the signal traces, and the signal list display region including a list of signals corresponding to the signal traces, wherein a signal trace of the signal traces specifies values of a signal in the signal list for the circuit design at different time points;
- receiving a selection of a time interval of the signal traces in the trace display region;
- creating a zoom group based in part or in whole on to the time interval, the zoom group spanning portions of the signal traces corresponding to the time interval of the signal traces; and
- adjusting a scaling factor of the portions of the signal traces within the zoom group along a temporal dimension axis independently of other portions of the signal traces within the trace display region and are outside of the zoom group.

2. The computer-readable storage medium of claim 1, wherein adjusting the scaling factor of the portions of the signal traces within the zoom group comprises zooming in to expand the portions of the signal traces within the zoom group horizontally.

3. The computer-readable storage medium of claim 1, wherein adjusting the scaling factor of the portions of the signal traces within the zoom group comprises zooming out to shorten the portions of the signal traces within the zoom group horizontally.

4. The computer-readable storage medium of claim 1, wherein adjusting the scaling factor of the portions of the signal traces within the zoom group comprises:
- collapsing the time interval of the zoom group in the trace display region into a fixed width along the temporal dimension axis; and
- displaying an object indicating a presence of a collapsed zoom group.

5. The computer-readable storage medium of claim 1, further comprising additional code for:
- receiving a selection of a subset of signals in the signal list;
- generating a second signal list display region stacked vertically and forming a first column with the signal list display region, wherein the second signal list display region includes the subset of signals; and
- generating a second trace display region adjacent to the second signal list display, the second trace display region forming a second column with the trace display region, wherein the second trace display region includes a subset of the signal traces corresponding to the subset of signals.

6. The computer-readable storage medium of claim 5, further comprising additional code for:
- vertically scrolling the second signal list display and the second trace display region independently from the first signal list display and the first trace display region.

7. The computer-readable storage medium of claim 1, further comprising additional code for:
- receiving an instruction to generate a second trace display region from the zoom group;
- generating the second trace display region horizontally adjacent to one of the signal list display region or the trace display region, the second trace display region comprising the portions of the signal traces spanning the time interval; and
- scrolling the second trace display region along a horizontal independently from the first trace display region.

8. The computer-readable storage medium of claim 1, wherein the portions of the signal traces within the zoom group and the other portions of the signal traces outside of the zoom group share a common horizontal scroll bar.

9. A computer implemented method for circuit design analysis, the method comprising:
- receiving signal traces for a circuit design;
- generating a signal list display region and a trace display region, the trace display region including the signal traces and the signal list display region including a list of signals corresponding to the signal traces, wherein a signal trace of the signal traces specifies values of a signal in the signal list for the circuit design at different time points;
- receiving a selection of a time interval of the signal traces in the trace display region with a scale management mechanism that includes or functions in conjunction with a processor executing instructions to identify the selection of the time interval;
- creating a zoom group based in part or in whole on to the time interval, the zoom group spanning portions of the signal traces corresponding to the time interval of the signal traces; and
- adjusting a scaling factor of the portions of the signal traces within the zoom group along a temporal dimension axis independently of other portions of the signal traces within the trace display region and are outside of the zoom group.

10. The method of claim 9, wherein adjusting the scaling factor of the portions of the signal traces within the zoom group comprises zooming in to expand the portions of the signal traces within the zoom group horizontally.

11. The method of claim 9, wherein adjusting the scaling factor of the portions of the signal traces within the zoom group comprises zooming out to shorten the portions of the signal traces within the zoom group horizontally.

12. The method of claim 9, wherein adjusting the scaling factor of the portions of the signal traces within the zoom group comprises:

collapsing the selected time interval of the zoom group in the trace display region into a fixed width along the time temporal dimension axis; and displaying an object indicating a presence of a collapsed zoom group.

13. The method of claim 9, further comprising:

receiving a selection of a subset of signals in the signal list;

generating a second signal list display region stacked vertically and forming a first column with the signal list display region, wherein the second signal list display region includes the subset of signals; and generating a second trace display region adjacent to the second signal list display, the second trace display region forming a second column with the trace display region, wherein the second trace display region includes a subset of the signal traces corresponding to the subset of signals.

14. The method of claim 13, further comprising:

vertically scrolling the second signal list display and the second trace display region independently from the first signal list display and the first trace display region.

15. The method of claim 9, further comprising:

receiving an instruction to generate a second trace display region from the zoom group;

generating the second trace display region horizontally adjacent to one of the signal list display region or the trace display region, the second trace display region comprising the portions of the signal traces spanning the time interval; and scrolling the second trace display region along a horizontal independently from the first trace display region.

16. The method of claim 9, wherein the portions of the signal traces within the zoom group and the other portions of the signal traces outside of the zoom group share a common horizontal scroll bar.

17. A system for analyzing circuit designs, comprising:

a memory storing thereupon program code;

a multi-region display generation mechanism that includes or functions in conjunction with a processor executing the program code to generate a signal list display region and a trace display region, the trace display region including the signal traces, and the signal list display region including a list of signals corresponding to the signal traces, wherein a signal trace of the signal traces specifies values of a signal in the signal list for the circuit design at different time points;

a scale management mechanism that includes or functions in conjunction with the processor executing the program code to receive a selection of a time interval of the signal traces in the trace display region; and the at least one processor further executing the program code to create a zoom group based in part or in whole on to the time interval, the zoom group spanning portions of the signal traces corresponding to the time interval of the signal traces and to adjust a scaling factor of the portions of the signal traces within the zoom group along a temporal dimension axis independently of other portions of the signal traces within the trace display region and are outside of the zoom group.

18. The system of claim 17, further comprising:

the at least one processor further executing the program code to collapse the time interval of the zoom group in the trace display region into a fixed width along the temporal dimension axis and to display an object indicating a presence of a collapsed zoom group.

19. The system of claim 17, further comprising:

the at least one processor further executing the program code to receive a selection of a subset of signals in the signal list, to generate a second signal list display region stacked vertically and forming a first column with the signal list display region, wherein the second signal list display region includes the subset of signals, and to generate a second trace display region adjacent to the second signal list display, the second trace display region forming a second column with the trace display region, wherein the second trace display region includes a subset of the signal traces corresponding to the subset of signals.

20. The system of claim 19, further comprising:

the at least one processor further executing the program code to vertically scroll the second signal list display and the second trace display region independently from the first signal list display and the first trace display region.

* * * * *